United States Patent [19]

Tamai

[11] 4,455,192
[45] Jun. 19, 1984

[54] FORMATION OF A MULTI-NOZZLE INK JET

[75] Inventor: Masayoshi Tamai, Kanagawa, Japan

[73] Assignee: Fuji Xerox Company, Ltd., Tokyo, Japan

[21] Appl. No.: 365,923

[22] Filed: Apr. 5, 1982

[30] Foreign Application Priority Data

May 7, 1981 [JP] Japan .................................. 56-68802

[51] Int. Cl.³ ........................................ H01L 21/308
[52] U.S. Cl. .................................... 156/628; 156/644; 156/647; 156/657; 156/662
[58] Field of Search ............... 156/628, 644, 647, 657, 156/662, 600; 346/75, 140 R; 239/548, 601, 690, 696

[56] References Cited

U.S. PATENT DOCUMENTS

| 3,921,916 | 11/1975 | Bassous | 239/601 |
|---|---|---|---|
| 4,256,532 | 3/1981 | Magdo et al. | 156/657 |
| 4,282,533 | 8/1981 | Brooks et al. | 346/75 |
| 4,381,341 | 4/1983 | Przybysz | 156/644 |
| 4,417,946 | 11/1983 | Bohlen et al. | 156/657 |

FOREIGN PATENT DOCUMENTS

| 52-67273 | 3/1977 | Japan | 156/644 |
|---|---|---|---|
| 52-67271 | 3/1977 | Japan | 156/644 |
| 55-49275 | 4/1980 | Japan | 346/75 |

OTHER PUBLICATIONS

Bassous, "High Density . . . Silicon", IBM Technical Disclosure Bulletin, vol. 19, No. 6, (11/76), pp. 2251-2252.

Chiou et al., "Ink Jet Nozzles", IBM Technical Disclosure Bulletin, vol. 19, No. 9, (2/77), p. 3569.

Primary Examiner—Jerome W. Massie
Attorney, Agent, or Firm—Sughrue, Mion, Zinn, Macpeak & Seas

[57] ABSTRACT

A method for the formation of a multi-nozzle ink jet is herein disclosed. In this method a single crystal silicon plate is masked and impurities are diffused upon its surface, creating regions of echant resistance. A second single crystal silicon plate is then grown onto the first, and is masked and etched. Due to the unisotropic etching properties of single crystal silicon plates, a groove is formed in the second plate, and a plurality of nozzles is formed in the first plate. This process yields a multi-nozzle ink jet of greater overall strength and utility, while eliminating the waste due to etching run common in the manufacture of conventional ink jets.

6 Claims, 9 Drawing Figures

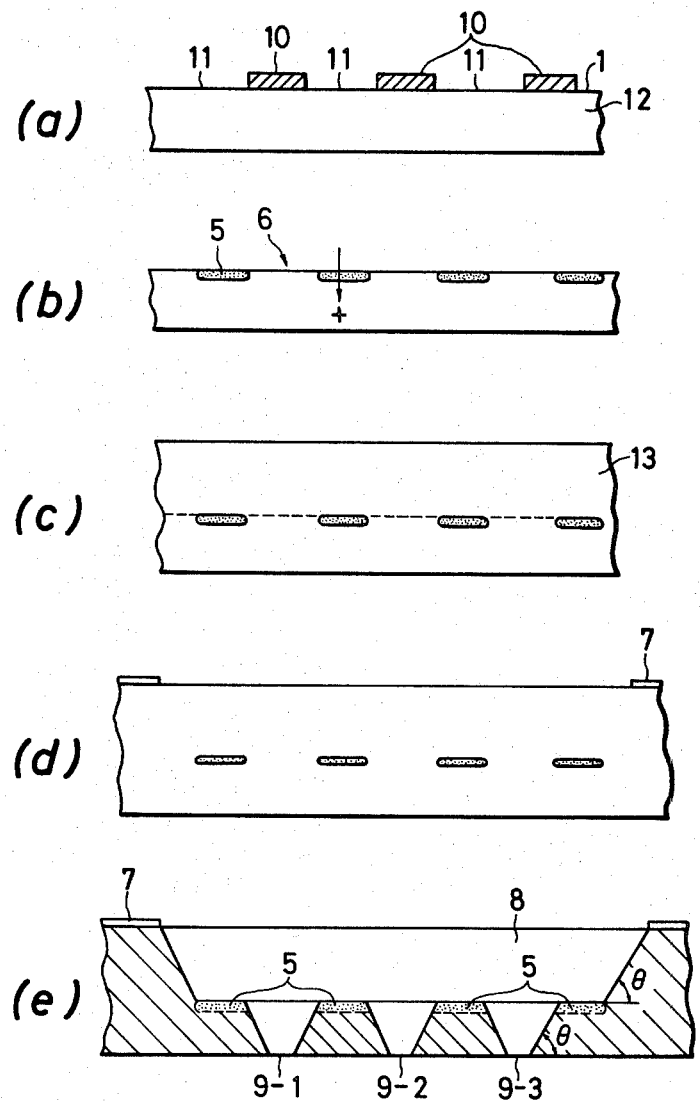

FORMATION OF A MULTI-NOZZLE INK JET

BACKGROUND OF THE INVENTION

This invention relates to a silicon nozzle formation method in which a multi-nozzle for an ink jet printer is formed, utilizing the anisotropic etching properties of single crystal silicons. The invention is particularly adopted to increasing the strength and overall utility of nozzles thus formed.

An ink jet multi-nozzle manufacturing method has been proposed in the art, in which, as shown in FIG. 1(a), a silicon single crystal is subjected to etching after a mask is placed on the <100> surface thereof exposing only the area (A). Due to the anisotropic etching properties of such silicon crystals, the resulting multi-nozzle is readily formed and is generally of high quality. Referring to FIG. 1(a), the etching angle $\theta$ is set to 54.7° in order to maximize the anisotropy of the silicon crystal. In order to form nozzles 3 at a small pitch, it is therefore necessary that the maximum thickness T of a single crystal silicon plate be equal to the nozzle pitch. For instance, in order to obtain a nozzle pitch of four nozzles per millimeter (mm), the thickness of the single crystal silicon plate should be of the order of 0.1 to 0.2 mm, taking into account the width (B) of each nozzle at its opening.

When the single crystal silicon plate is subjected to anisotropic etching, the single crystal silicon plate 12 is mounted on a holder 19 as shown in FIG. 1(b), and is fixed with retainers 20. An etching solution 17 is then applied to the single crystal plate 12. Under the above-described circumstances, due to the fact that the crystal plate 12 is of small width, it is impossible to sufficiently tighten the crystal plate 12 with the retainers 20. This in turn creates the probability of the etching solution leaking into the crystal plate at points other than those intended, i.e., other than the exposed portions that have not been masked.

SUMMARY OF THE INVENTION

Accordingly, this invention is intended to provide a method of forming an ink jet multi-nozzle in which the above-described drawbacks accompanying a conventional method are eliminated. The foregoing object of the invention has been achieved by the provision of an ink jet multi-nozzle which is made of a single silicon crystal, and in which a common groove for all nozzles forming the multi-nozzle is cut into one surface of the multi-nozzle body. The groove constrains the etchant to the wafer and precluding leaking. The nozzles have openings at the bottom of this common groove, while providing an ink jetting surface which retains the aforementioned attributes of high quality and ready formation.

BRIEF DESCRIPTION OF THE DRAWINGS

FIGS. 2(a)-2(e), are step diagrams that detail the manufacture of an ink jet multi-nozzle according to the method of the invention;

DETAILED DESCRIPTION OF THE PREFERRED EMBODIMENT

Figure 3:
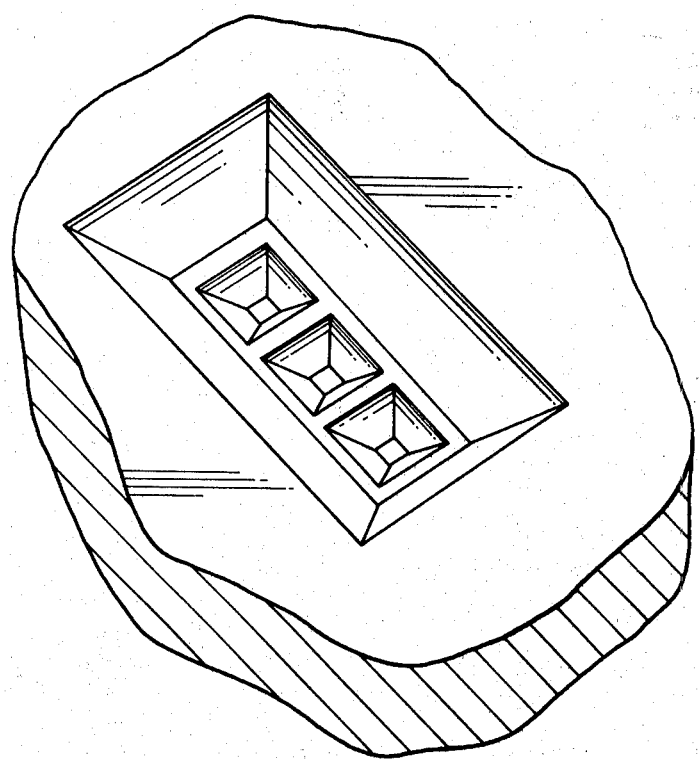
FIG. 3 is a front perspective view of an ink jet multi-nozzle manufactured in the method of the invention.

One embodiment of this invention will be described in detail with reference to FIGS. 2 through 4.

Figure 1A:
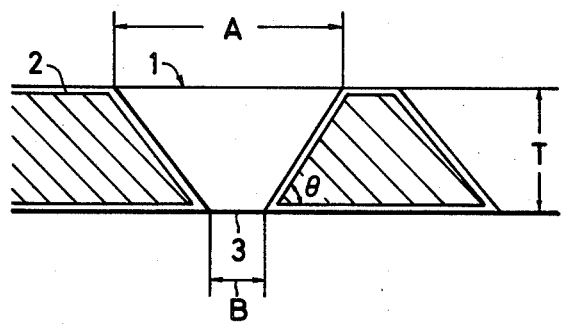
FIG. 1(a) is a cross-sectional view of an ink jet multi-nozzle which has been manufactured in the conventional method.
Figure 1B:
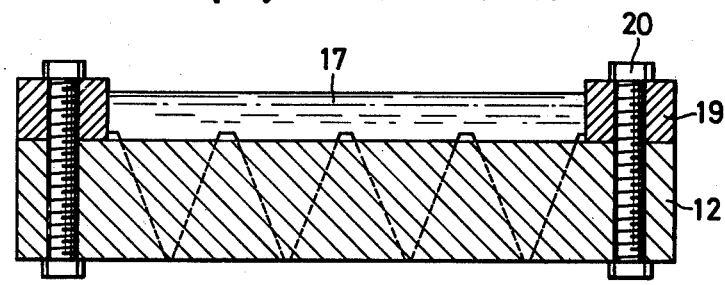
FIG. 1(b) is a cross-sectional view of a conventional ink jet multi-nozzle which has been mounted for etching.

As shown in FIG. 2(a), a mask 10 is placed in close contact with the <100> surface 1 of a silicon single crystal. Impurities are diffused into exposed regions 11 of the <100> surface 1 which are not covered by the mask 10, forming etching resistive layers 5 shown in FIG. 2(b). A silicon crystal 13 is grown onto the silicon surface thus treated (FIG. 2(c)), to form a silicon single crystal laminated body. The silicon single crystal laminated body thus formed is then subjected to an etching process. Referring now in more detail to FIGS. 2(a)-2(c), a silicon crystal 12 of 0.1 mm in thickness is provided and Boron is diffused into the regions of the <100> surface of the silicon crystal which are not covered by the mask 10. This diffusion forms P+ layers 5 and achieves a density of nozzles at four nozzles/mm. In FIG. 2(b), reference numeral 6 designates regions where no impurities are diffused. The regions 6 correspond to the upper openings 1 in FIG. 1 at an opening width (A).

A second single silicon crystal 13 is then grown to a 0.7 mm height above the diffused layers 5, burying the diffused layers in the newly formed wafer as shown in FIG. 2(c). An etching mask 7, shown in FIG. 2(d), is placed on the upper surface of the wafer, to form a common groove for the nozzles. An etching solution is prepared by mixing ethylene diamine, pyrocatecol and water in the following rates:

ethylene diamine—3.125 ml
pyrocatecol—0.5 g
water—1 ml

By the application of the etching solution thus prepared to the wafer, anisotropic etching occurs. That is, the etching 8 first advances uniformly to the buried layers 5 as indicated in FIG. 2(e). The etching then advances past the buried impurity layers 5, which perform as masks, to form an array of nozzles 9-1, 9-2 and 9-3 with a pitch of 0.25 mm. A perspective view of the nozzle array thus formed is illustrated in FIG. 3.

As is apparent from FIG. 2(e), the thickness of the silicon wafer can be maintained at 0.8 mm; that is, by virtue of the grown silicon crystal, the thickness of the wafer is no longer constrained by the high concentration of nozzles which greatly enhances the mechanical strength of the wafer.

Figure 4:
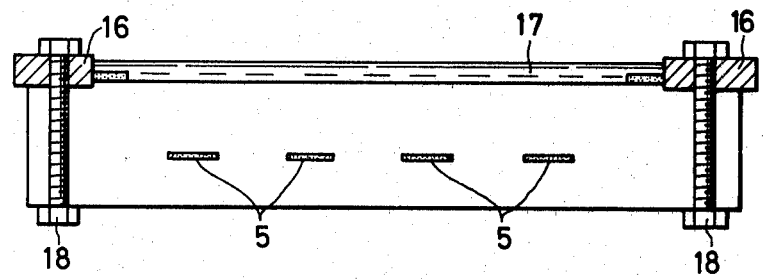
FIG. 4 is a cross-sectional view of an ink jet multi-nozzle manufactured in the method of the invention which has been mounted for etching.

The wafer according to the invention in FIG. 2(d) can now be readily mounted in an etching bath as shown in FIG. 4 without the probability of etching liquid escape, which existed in the conventional silicon nozzles. Also, a sufficiently high concentration of nozzles per millimeter can be maintained, without compromising the mechanical strength of the nozzle wafer.

What is claimed is:

1. A method for the formation of a multi-nozzle ink jet, comprising the steps of:
    masking the surface of a single crystal silicon plate;

diffusing impurities onto the unmasked regions of said plate to render said unmasked regions resistant to known etching compositions;

growing a second single crystal silicon plate onto said first single crystal silicon plate;

masking the surface of said second single crystal silicon plate; and diffusing an etching composition onto said masked second single crystal silicon plate, whereby said etching composition creates an opening in said second single crystal silicon plate, and creates a plurality of nozzles in said first single crystal silicon plate.

2. The novel method of formation of a multi-nozzle ink jet as in claim 1, wherein said first single crystal silicon plate has a thickness substantially equal to the pitch of said plurality of nozzles.

3. The method for the formation of a multi-nozzle ink jet as in claim 1, wherein said first single crystal silicon plate is of approximately 0.1 to 0.2 mm in thickness and said second single crystal silicon plate is of approximately 0.6 to 0.9 mm in thickness.

4. The method for the formation of a multi-nozzle ink jet as in claim 1, wherein said impurities diffused onto said first single crystal silicon plate comprise boron to form P+ regions.

5. The method for the formation of a multi-nozzle ink jet as in claim 1, wherein said etching composition comprises water, ethylene diamine and pyrocatecol.

6. The method for the formation of the multi-nozzle ink jet as in claim 1, wherein said plurality of nozzles created in said first single crystal silicon plate have a pitch of approximately 0.25 mm and have a concentration of 6 to 10 nozzles per millimeter of length.

* * * * *